July 10, 1956 C. J. HATHORN 2,754,486

PRINTED CIRCUIT ELECTRICAL COMPONENT

Filed Oct. 20, 1953

INVENTOR.
CLARENCE J. HATHORN

BY

Brown, Critchlow, Flick & Peckham
his ATTORNEYS.

2,754,486
Patented July 10, 1956

2,754,486

PRINTED CIRCUIT ELECTRICAL COMPONENT

Clarence J. Hathorn, St. Marys, Pa., assignor to Stackpole Carbon Company, St. Marys, Pa., a corporation of Pennsylvania Application October 20, 1953, Serial No. 387,237

4 Claims. (Cl. 339—17)

This invention relates to printed circuits and their electrical components.

The term "printed circuit" as used herein means electrical conductor strips that have been printed or plated or otherwise intimately secured on an insulating panel before any electrical components are attached. Since printed circuits generally are quite small and the components therefor are of miniature size, it is difficult to hold the components in proper position while they are being soldered to the conductors of the circuit.

It is among the objects of this invention to provide printed circuit electrical components which can be quickly applied to the circuit and held in predetermined positions until they can be soldered in place, which are held in place by their own leads, which permit automatic soldering of the components in the circuits, and which allow their bodies to be disposed on the side of a printed circuit panel opposite to the conductors.

In accordance with this invention a pair of the thin electrical conductors that are printed on the front of a thin insulating panel have a pair of laterally spaced holes extending through them and the panel. The body of an electrical component has wire leads projecting from it which have portions extending in the same direction for insertion in the holes just mentioned, with the component body engaging the back of the panel. The tips of the leads project from the conductors. The holes are considerably larger than the leads. To hold the component in place until it can be soldered to the conductors, the leads are provided with crimps which press against the sides of the holes and preferably spread the projecting ends of the leads apart to lock them in position. The tips of the leads then can be soldered to the conductors by dipping them in solder.

The preferred embodiment of the invention is illustrated in the accompanying drawings, in which—

Figure 1:
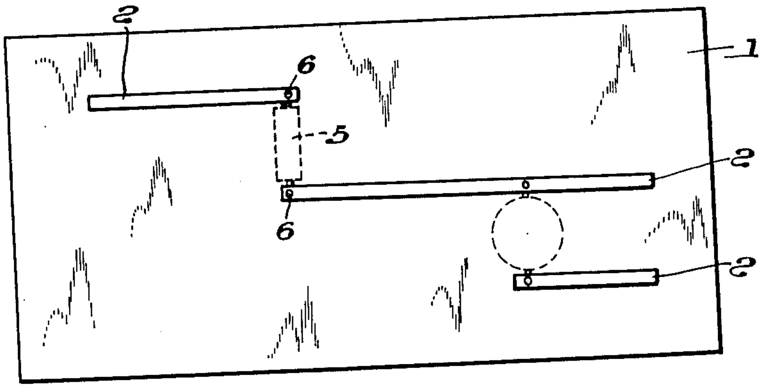
Fig. 1 is a front view of a printed circuit showing the bodies of two electrical components in dotted lines behind the panel.

Referring to Fig. 1 of the drawings, a thin insulating panel 1, one-twentieth of an inch thick for example, has a wiring diagram of any desired form applied to its front surface by printing thin conductor strips 2 on it in any suitable manner well known in the printed circuit art. At points on the conductors where electrical components are to be attached, the conductors and the panel behind them are provided with aligned openings forming holes 3. The holes are arranged in laterally spaced pairs the correct distance apart for receiving the leads of the proper component. Although almost any electrical component can be attached to the circuit in the manner contemplated by this invention, for purposes of illustration a fixed resistor of a well known type has been selected.

Figure 2:
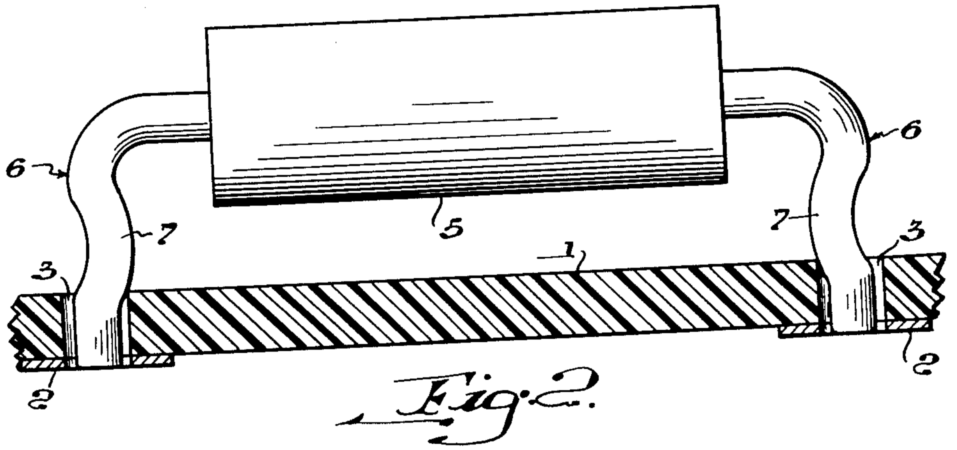
Fig. 2 is a greatly enlarged side view of a section through the printed circuit, showing one of the components starting to be applied to the circuit.
Figures 3, 4:
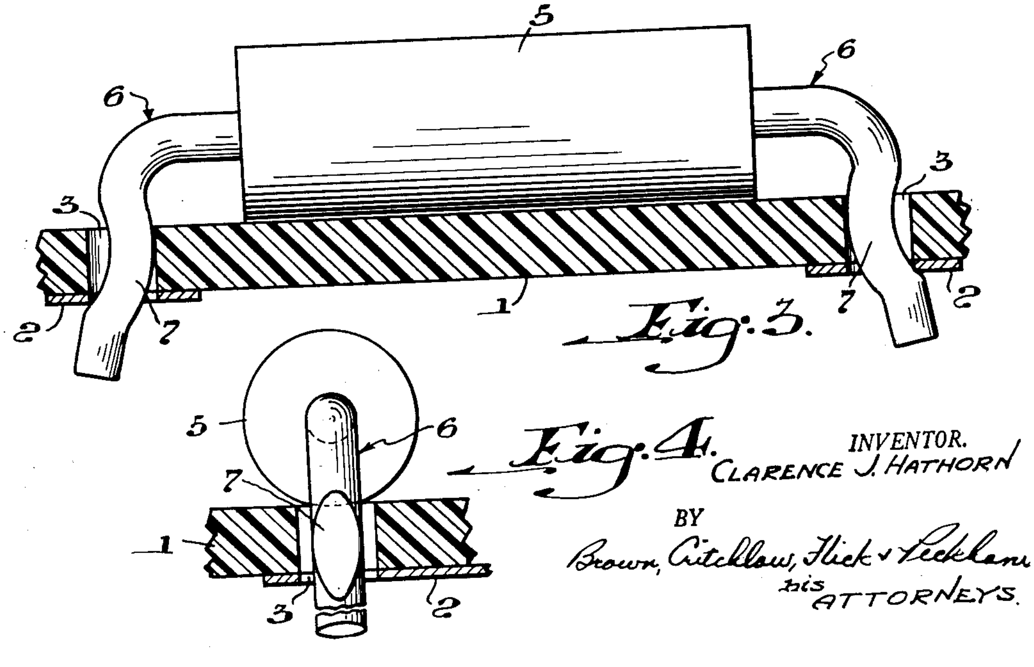
Fig. 3 is a similar view showing the component snapped into place but before it has been soldered in place.
Fig. 4 is an end view of the component of Fig. 3.

As shown in Figs. 2, 3 and 4, this resistor has an elongated cylindrical body 5 of suitable resistance material, from the opposite ends of which wire leads 6 extend in opposite directions. The inner end portion of each lead extends axially away from the resistor body for a short distance and then is bent so that its outer portion is at substantially right angles to its inner portion, as shown in Fig. 2. The outer portions extend in the same direction, and it is desirable that short lengths of the outer ends be substantially straight and parallel; that is, perpendicular to the inner portions of the leads, so that they can easily be inserted in a pair of the holes 3. The center-to-center distance between the ends of the leads is substantially the same as that of the two holes. The leads are long enough to project a short distance from the front of the panel and the electrical conductors thereon when the body of the resistor engages the back of the panel.

It is a feature of this invention that when the resistor is applied in this manner to the printed circuit it will be locked in place temporarily until it can be soldered to the conductors, thereby avoiding loosening or loss of the resistor. Accordingly, the diameter of the holes 3 that receive the resistor leads is made considerably greater than the diameter of the leads, and the outer portion of each lead between its straight end and the straight inner portion is provided with a crimp 7 that will be located inside one of the oversize holes when the body of the resistor is in engagement with the panel. The crimp is a laterally curved or offset portion of the lead having a convex side and a concave side. It can be formed at the same time the lead is bent laterally and trimmed. For best results the two crimps should project either away from or toward each other, preferably the latter. When they project toward each other as shown in Fig. 2, the distance between the crimps is slightly less than the distance between the holes in which the ends of the leads are inserted. The crimps therefore resist further insertion of the leads into the holes. Consequently, when the resistor is pressed hard enough to push the crimps into the holes, the sides of the holes spread the leads farther apart, as shown in Fig. 3. This produces a clamping action between the crimps and the sides of the panel holes. It also swings the straight outer ends of the leads away from each other so that they extend diagonally across the outer edges of the holes and thereby lock the resistor in place, with its body against the panel and its leads projecting from conductors 2. The dimensions preferably are such that the outer end of the concave side of each crimp more or less hooks over the adjoining conductor.

With this construction, when a component is inserted in a panel and pushed into place the resistor actually snaps into position and is held securely. After all of the components have been applied to the printed circuit the circuit can be dipped conductor side down into molten solder which will solder the projecting tips of the component leads to the conductors through which they extend. This soldering operation can be carried out automatically. All of the soldered connections are fully exposed on the front of the panel, while the components are hidden from view behind it. No means in addition to the components themselves are required for holding them in place until they are soldered. There is no danger of the components becoming dislodged or displaced during the interval between their application to the printed circuit and their permanent connection to it by solder.

According to the provisions of the patent statutes, I have explained the principle of my invention and have illustrated and described what I now consider to represent its best embodiment. However, I desire to have it understood that, within the scope of the appended claims, the invention may be practiced otherwise than as specifically illustrated and described.

I claim:

1. The combination with a thin insulating panel provided on its front surface with thin electrical conductors having a pair of laterally spaced holes extending through them and the adjoining panel, of an electrical component comprising a body substantially engaging the back of the panel, and wire leads projecting from the body and having portions extending through said holes and projecting from the adjoining conductors, said holes being considerably larger than the leads, and each of said lead portions being provided with a crimp pressing against one side of a hole and forcing part of the lead against the adjoining conductor of the opposite side of the hole, whereby said component is held in position until the projecting ends of said leads can be soldered to said conductors.

2. The combination with a thin insulating panel provided on its front surface with thin electrical conductors having a pair of laterally spaced holes extending through them and the adjoining panel, of an electrical component comprising a body substantially engaging the back of the panel, and wire leads projecting from the body and having portions extending through said holes and projecting from the adjoining conductors, said holes being considerably larger than the leads, each of said lead portions being provided with a crimp having a longitudinally convex side and a concave side, and the convex side pressing tightly against one side of a hole and the outer end of the concave side engaging the outer edge of the opposite side of the hole, whereby said component is held in position until the projecting ends of said leads can be soldered to said conductors.

3. The combination with a thin insulating panel provided on its front surface with thin electrical conductors having a pair of laterally spaced holes extending through them and the adjoining panel, of an electrical component comprising an elongated body substantially engaging the back of the panel, and wire leads projecting in opposite directions from opposite ends of the body, said holes being considerably larger than the leads, each lead having an inner portion extending substantially parallel to the panel and an outer portion extending through one of said holes and projecting from the adjoining conductor, and said outer portion of the lead being provided with a crimp having a longitudinally convex side pressing against one side of the hole and forcing the opposite side of the lead against the adjoining conductor, whereby said component is held in position until the projecting ends of said leads can be soldered to said conductors.

4. The combination with a thin insulating panel provided on its front surface with thin electrical conductors having a pair of laterally spaced holes extending through them and the adjoining panel, of an electrical component comprising a body substantially engaging the back of the panel, and wire leads projecting in opposite directions from opposite ends of the body, said holes being considerably larger than the leads, each lead having an inner portion extending substantially parallel to the panel and each an outer portion extending through one of said holes and projecting from the adjoining conductor, and said outer portion of the leads being provided with a crimp projecting laterally toward the other lead and pressing against one side of the panel hole, said outer portions being held at an inclination to each other by the engagement of said crimps against the sides of said holes, whereby said component is held in position until the projecting ends of said leads can be soldered to said conductors.

References Cited in the file of this patent

UNITED STATES PATENTS

| | | |
|---|---|---|
| 2,037,620 | Dewhurst | Apr. 14, 1936 |
| 2,066,876 | Carpenter et al. | Jan. 5, 1937 |
| 2,211,739 | Churchill | Aug. 13, 1940 |
| 2,519,121 | Del Camp | Aug. 15, 1950 |
| 2,553,287 | Yates | May 14, 1951 |

FOREIGN PATENTS

| | | |
|---|---|---|
| 649,254 | Great Britain | Jan. 24, 1951 |